United States Patent [19]
Suzuki et al.

[11] Patent Number: 5,862,038
[45] Date of Patent: Jan. 19, 1999

[54] COOLING DEVICE FOR MOUNTING MODULE

[75] Inventors: Masahiro Suzuki; Junichi Ishimine; Hisashi Kawashima; Keizo Takemura; Kiyotaka Seyama, all of Kawasaki, Japan

[73] Assignee: Fujitsu Limited, Kawasaki, Japan

[21] Appl. No.: 825,679

[22] Filed: Mar. 20, 1997

[30] Foreign Application Priority Data

Aug. 27, 1996 [JP] Japan .................................. 8-225408

[51] Int. Cl.⁶ ...................................................... H05K 7/20
[52] U.S. Cl. ........................ 361/704; 361/690; 361/703; 361/709; 257/719; 165/80.2; 165/80.3
[58] Field of Search ..................................... 361/704, 705, 361/688, 707, 709, 710; 257/706, 707, 709, 717–720; 165/80.2, 80.3, 80.4, 185

[56] References Cited

U.S. PATENT DOCUMENTS

| | | | |
|---|---|---|---|
| 4,235,283 | 11/1980 | Gupta ................................... | 165/80.04 |
| 4,448,240 | 5/1984 | Sharon .................................. | 165/80.4 |
| 4,462,462 | 7/1984 | Meagher et al. ..................... | 165/80.04 |
| 4,639,829 | 1/1987 | Ostergren et al. ..................... | 361/704 |
| 4,897,764 | 1/1990 | Bruchmann et al. ................... | 361/705 |
| 5,028,989 | 7/1991 | Naganuma et al. .................... | 257/714 |
| 5,291,371 | 3/1994 | Gruber et al. .......................... | 361/705 |
| 5,390,076 | 2/1995 | Umezawa ................................ | 361/689 |

FOREIGN PATENT DOCUMENTS

| | | | |
|---|---|---|---|
| 60-94748 | 5/1985 | Japan ..................................... | 257/719 |
| 2-1959 | 1/1990 | Japan ..................................... | 257/719 |

*Primary Examiner*—Leo P. Picard
*Assistant Examiner*—Boris L. Chervinsky
*Attorney, Agent, or Firm*—Stass & Halsey

[57] ABSTRACT

A cooling device for a mounting module in which heat generated from a predetermined number of circuit elements mounted on the mounting module is dissipated by a cooling arrangement. The cooling device is comprised of at least one conduction element which thermally connects the circuit element with the cooling arrangement, the conduction element includes a predetermined number of first conductive members which is placed in a respective hole formed in the conduction arrangement and is movably supported by a first conductive material filled between the side surface of the first conductive member and the surface of the conduction element so as to complete a thermal flow from the circuit element to the cooling arrangement.

14 Claims, 13 Drawing Sheets

COOLING DEVICE FOR MOUNTING MODULE

BACKGROUND OF THE INVENTION

The present invention generally relates to a cooling device for a mounting module, and more particularly, to a cooling device which is capable of lowering a temperature of a small flat heat generating device such as an integrated circuit chip.

Recently, circuits used for electrical devices such as a personal computer, information processor, work station and server are highly integrated and the capacity of semiconductor devices mounted on a control plate circuit has greatly increased. This results in a temperature raise in such electrical devices and therefore there is a need to dissipate the heat generated from circuit plates or the semiconductor devices in an efficient manner.

FIGS. 1A and 1B are diagrams for explaining a conventional cooling device for a mounting module.

A cooling device 11A shown in FIG. 1A is comprised of a printed board 12, circuit elements 13, a heat sink 14 and conductive members 15. A predetermined number of circuit elements 13 such as semiconductor chips are mounted on the printed board 12 and the heat sink 14 having the shape of a flat plate is located above the circuit element 13. The back of the heat sink 14 is connected to the upper surface of each of the circuit element 13 via the conductive member 15 which is usually made of a silicon compound. Thus, the heat generated from the circuit elements 13 is dissipated from the heat sink 14.

The above-mentioned conductive member 15 makes it possible to effectively transmit the heat generated from the circuit elements 13 by supplementing the surface flatness, surface roughness and surface inclination so as to decrease a thermal resistance at a contacting surface (i.e., increase in the contacting surface area). However, it is effected by the thickness of the conductive member 15, which has a certain thermal resistance, upon heat dissipation. The thermal resistance R of the conductive member 15 may be expressed by the following formula (1):

$$R = t/(\lambda \cdot A) \quad (1)$$

wherein $\lambda$ indicates the thermal conductivity [W/(m K)] of a conductive member, A indicates a conductive area [m$^2$] of the conductive member, and t indicates a mean thickness [m] of the conductive member.

FIG. 1B is a diagram showing another conventional cooling device 11B comprising a printed board 12, circuit elements 13, a conductive member 15, a cooling header 21, a block 22, a spring 23 and a heat sink (not shown in the figure). The cooling header 21 is located above the circuit elements 13 mounted on the printed board 12. The cooling header 21 has a hole 21a in a position corresponding to the position of each of the circuit elements 13 and the block 22 is inserted in the hole 21a so that it is in contact with the circuit element 13 via the conductive member 15. The spring 23 presses the block 22 towards the circuit element 13 to assure the contact between the block 22 and the circuit element 13. Heat is transmitted from the block 22 to the cooling header 21 by physical contact between the two or by use of a gas.

In the above-mentioned cooling device shown in FIG. 1B, since the block 22 is pressed to the circuit element 13 by the spring 23, the thickness $t_1$ of the conductive member 15 is made thinner and the thermal resistance R becomes smaller compared with the case shown in FIG. 1A, and hence the thermal conductivity and the dissipating efficiency may be improved.

However, the cooling device 11B shown in FIG. 1B has some disadvantages. For instance, since the block 22 is pressed to the circuit element 13 by the elastic force of the spring 23, although it is capable of equalizing the difference in the thickness of the conductive member 15, a load applied to the circuit element 13 is increased by, say, vibration and there is a danger that solder balls 16 connecting the circuit element 13 to the printed board 12 may be broken or the circuit element 13 itself destroyed. Also, if the elastic force of the spring 23 is attenuated in order to avoid the above problems, the block 22 may be easily shaken by an outer force and the thickness $t_1$ of the conductive member 15 may be changed. Thus, there are possibilities that the heat dissipating efficiency of the device is decreased and the cooling performance is lowered.

SUMMARY OF THE INVENTION

Accordingly, it is a general object of this invention to provide a cooling device for a mounting module in which the above-mentioned problems are eliminated.

A more specific object of the present invention is to provide a cooling device for a mounting module having an improved cooling performance.

Another object of the present invention is to provide a cooling device for a mounting module by which heat dissipation may be performed efficiently.

Yet another object of the present invention is to provide a cooling device for a mounting module which is capable of not applying any unnecessary load to a circuit element or solder balls connected thereto, and hence preventing a destruction thereof.

The objects described above are achieved by a cooling device for a mounting module in which heat generated from a predetermined number of circuit elements mounted on the mounting module is dissipated by a cooling means comprising: at least one conduction means which thermally connects the circuit elements with the cooling means, wherein the conduction means includes a predetermined number of first conductive members which are placed in a respective hole formed in the conduction means and are movably supported by a first conductive material filled between the side surface of the first conductive member and the surface of the respective hole of the conduction means.

The objects described above are also achieved by the cooling device for a mounting module, wherein a second conductive material is present between the first conductive member and the circuit element.

The objects described above are also achieved by the cooling device for a mounting module, wherein the first conductive material has substantially an even thickness around the first conductive member.

According to the above cooling device, since the conduction means placed between the circuit elements and the cooling means supports the predetermined number of the first conductive members with the first conductive material, filled evenly around each of the first conductive members which closely contacts the respective circuit element via the second conductive material, the thickness of the second conductive material, which is present between each of the circuit elements and the respective first conductive member, may be easily adjusted. Also, since each of the first conductive members is supported by the first conductive material filled around the side surface of the first conductive member, it is possible to prevent or attenuate the shock which may be applied to a circuit element due to the viscosity and anti-abrasion property of the first conductive material.

The objects described above are also achieved by the cooling device for a mounting module, wherein a predetermined number of injection passages for filling one of the first conductive material, the second conductive material, and the first conductive material and the second conductive material are provided with the first conductive member.

The objects described above are also achieved by the cooling device for a mounting module, wherein at least two of the predetermined number of injection passages are connected with each other.

The objects described above are also achieved by the cooling device for a mounting module, wherein at least two of the predetermined number of injection passages include an injection passage for filling the first conductive material and an injection passage for filling the second conductive material.

The objects described above are also achieved by the cooling device for a mounting module, wherein the ratio of a total outlet surface area of the injection passages for filling the first conductive material and a total outlet surface area of the injection passages for filling the second conductive material is substantially the same as the ratio of an amount of the first conductive material to be filled around the side surface of the first conductive member and an amount of the second conductive material to be filled between the circuit element and the first conductive member.

According to the above cooling device, the injection passage for filling the first conductive material around the side surface of the first conductive member and the injection passage for filling the second conductive material between the circuit element and the first conductive member is formed separately or in a connected state. Since the thermal conductivity of the first conductive material is not as good as that of a metal used for cooling parts such as the heat sink, it is better to make the thickness of the first conductive material in a heat transfer direction as thin as possible. Also, the ratio of a total outlet surface area of the injection passages for filling the first conductive material and a total outlet surface area of the injection passages for filling the second conductive material is made substantially the same as the ratio of an amount of the first conductive material to be filled around the side surface of the first conductive member and an amount of the second conductive material to be filled between the circuit element and the first conductive member. Thus, it becomes possible to carry out the filling operation of the first and second conductive materials at the same time, and hence the number of steps required for constructing the device may be reduced. Moreover, it becomes possible to control the amount of the conductive materials and the cooling performance of the device may be improved.

The objects described above are also achieved by the cooling device for a mounting module, wherein the first conductive member includes an extending portion having a hook shape, and the conduction means includes a hook portion to be engaged with the extending portion of the first conductive member.

The objects described above are also achieved by the cooling device for a mounting module, wherein the first conductive material is present between the extending portion of the first conductive member and the hook portion of the conduction means.

The objects described above are also achieved by the cooling device for a mounting module, wherein a predetermined number of elastic members is provided between the first conductive member and the cooling means in order to press the first conductive member towards the circuit element.

According to the above cooling device, the first conductive member is supported by the conduction means and is pressed by the predetermined number of elastic members towards the circuit element. Thus, the first conductive member is rotatably inserted in the hole formed in the conduction means and at that time the first and second conductive materials are spread evenly around the side surface of the first conductive member and between the circuit element and the bottom surface of the first conductive member, respectively. Also, the contacting surface area of the first conductive member and the conduction means is increased, compared with a case in which a first conductive member having a cylinder shape is used, and therefore the thermal resistance of the first conductive material portion may be decreased and the cooling efficiency of the device may be improved.

The objects described above are also achieved by the cooling device for a mounting module, wherein a second conductive member is provided between the circuit element and the first conductive member, and the second conductive material is present between the first conductive member and the second conductive member.

The objects described above are also achieved by the cooling device for a mounting module, wherein the second conductive member has an upper portion, facing the first conductive member, having a concave shape and the first conductive member has a lower portion having a convex shape which may be engaged with the upper portion having a concave shape.

The objects described above are also achieved by the cooling device for a mounting module, wherein a second conductive member is provided between the circuit element and the first conductive member, and the second conductive material is present between the first conductive member and the second conductive member.

According to the above cooling device, the second conductive member is provided on the circuit element and the second conductive material is provided between the first conductive member and the second conductive member. The second conductive member may have an upper portion having a concave shape and the first conductive member may have a lower portion having a convex shape which may be engaged with the upper portion of the second conductive member. Thus, the shift of the central axis of the first conductive member and that of the second conductive member may be avoided and the second conductive material may be distributed evenly between the first and the second conductive members. Therefore, the cooling performance of the device may be improved.

The objects described above are also achieved by the cooling device for a mounting module, wherein a sealing member is provided on the second conductive member in order to seal the second conductive material.

According to the above cooling device, since the sealing member for sealing the second conductive material is provided on the second conductive member, it becomes possible to prevent leaking of the second conductive material which may occur during an exchanging process of the other circuit element mounted on the same printed board using, for instance, a liquid solvent if the sealing member is not used. Also, leaking of the second conductive member may be prevented during a washing process usually carried out after the exchanging process.

The objects described above are also achieved by the cooling device for a mounting module, wherein the conduction means includes a step portion, on which the first conductive material may be applied, which is engaged with an extending portion of the first conductive member.

The objects described above are also achieved by the cooling device for a mounting module, wherein a sealing member is provided on the step portion.

According to the above cooling device, the step portion which is engaged with the extending portion of the first conductive member is provided with the conduction means and the first conductive material, which may be surrounded by the sealing member, is provided on the step portion. Thus, leaking of the first conductive material may be prevented and the material may be filled evenly around the first conductive member.

The objects described above are also achieved by the cooling device for a mounting module, wherein a magnetic means which is capable of attaching the first conductive member with the second conductive member by a magnetic force is provided with the first conductive member and the second conductive member.

According to the above cooling device, the magnetic means is provided with the first conductive member and the second conductive member. Hence, it is possible to carry out a pressurizing operation of the first conductive member to the second conductive member without giving any pressure on the circuit element and the printed board. Thus, the danger that the circuit element or the printed board is damaged during the pressurizing operation may be eliminated. Also, the thickness of the second conductive material may be maintained evenly and the cooling performance of the device may be improved.

Other objects and further features of the present invention will be apparent from the following detailed description when read in conjunction with the accompanied drawings.

DESCRIPTION OF THE PREFERRED EMBODIMENTS

In the following, a principle and an embodiment of the present invention will be described with reference to the accompanying drawings.

Figure 2A:
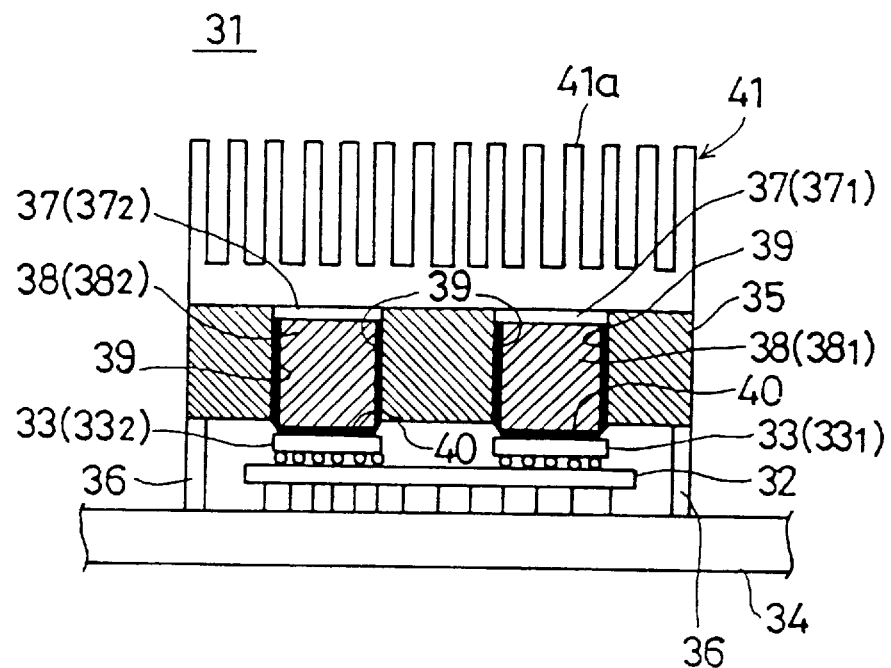
FIG. 2A is a diagram showing a cross-sectional view of a cooling device according to the first embodiment of the present invention.

First, a description will be given of a first embodiment of the cooling device for a mounting module according to the present invention with reference to FIGS. 2A and 2B. FIG. 2A is a diagram showing a cross-sectional view of a cooling device 31 according to the first embodiment of the present invention. The cooling device 31 is comprised of a printed board 32, circuit elements 33 ($33_1$ and $33_2$), a mother board 34, a cooling header 35, supporting members 36, holes 37 ($37_1$ and $37_2$), blocks 38 ($38_1$ and $38_2$), first conductive materials 39, second conductive materials 40, and a heat sink 41 which is a cooling means according to the present invention. A predetermined number of the circuit elements 33 ($33_1$ and $33_2$) such as bare chips are mounted on the printed board 32 and a predetermined number of the printed boards 32 is mounted on the mother board 34.

The cooling header 35, which is a conduction means according to the present invention, is placed above the circuit elements 33 by the supporting member 36 fixed on the mother board 34. This is to avoid the application of unnecessary load due to the construction members, such as the cooling header 35, to the printed circuit 32 which may be formed by a silicon material. The cooling header 35 may be formed by, for instance, aluminium or copper which has a good thermal conductivity, and the holes 37 ($37_1$ and $37_2$) are formed corresponding to the number and the position of the circuit elements 33 ($33_1$ and $33_2$).

The blocks 38 ($38_1$ and $38_2$), which are first conductive members according to the present invention, are respectively inserted in the holes 37 ($37_1$ and $37_2$). The blocks 38 may be formed in a cylindrical shape, so that they may be readily inserted in the holes 37. The blocks 38 are formed using a metal having a good thermal conductivity such as aluminium or copper. The first conductive material 39, which is a filling member having a good thermal conductivity such as a silicon compound and silicon grease, is filled between the side surface of each of the blocks 38 and the respective holes 37. Each of the blocks 38 is supported by the cooling header 35.

The lower surface of each of the blocks 38 closely contacts the respective circuit element 33 via the second conductive material 40 formed by materials such as a silicon compound and silicon grease.

The heat sink 41, which is the cooling means as mentioned above, has a predetermined number of fins 41a made of, for instance, aluminium and is provided on the cooling header 35 so as to be thermally connected.

Figure 2B:
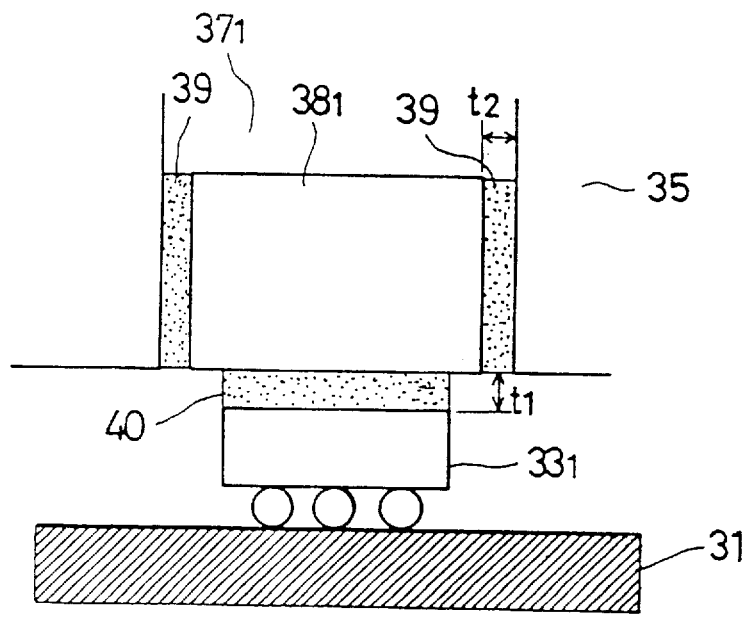
FIG. 2B is a diagram showing main parts of the cooling device according to the first embodiment of the present invention shown in FIG. 2A.

FIG. 2B is a diagram showing main parts of the cooling device 31 according to the first embodiment of the present invention shown in FIG. 2A. In FIG. 2A, elements which are the same as the ones in FIG. 2A are indicated by the same reference numerals and the explanation thereof will be omitted.

In FIG. 2B, providing that the surface flatness of the circuit element $33_1$ and that of the block $38_1$ is made to be less than about 20 μm, it is possible to provide the conductivity material 40 having a thickness $t_1$, of less than about 20 μm by applying a pressure of about 200 to 400 gf/cm² from the block $38_1$ to the circuit element $33_1$ via the second conductive material 40. The distance $t_2$ between the side surface of the block $38_1$ and the inner surface of the hole 37 of the cooling header 35 is determined to be, for instance, about 50 μm and the first conductive material 39 is applied therebetween in order to support the block $38_1$ by the cooling header 35.

The thermal resistance $R_1$ of the second conductive material 40 between the circuit element $33_1$ and the block $38_1$ may be expressed by the following formula (2):

$$R_1 = t_1/(\lambda \cdot A_1) \quad (2)$$

wherein $A_1$ indicates the contacting surface area of the block and the circuit element.

The thermal resistance $R_2$ of the first conductive material 39 between the block $38_1$ and the cooling header 35 may be expressed by the following formula (3):

$$R_2 = t_2/(\lambda A_2) \quad (3)$$

wherein $A_2$ indicates the contacting surface area of the block and the cooling header.

Therefore, the total thermal resistance R between the circuit element $33_1$ and the cooling header 35 due to the first and the second conductive materials 39 and 40 is expressed as $R = R_1 + R_2$.

Figure 1A:
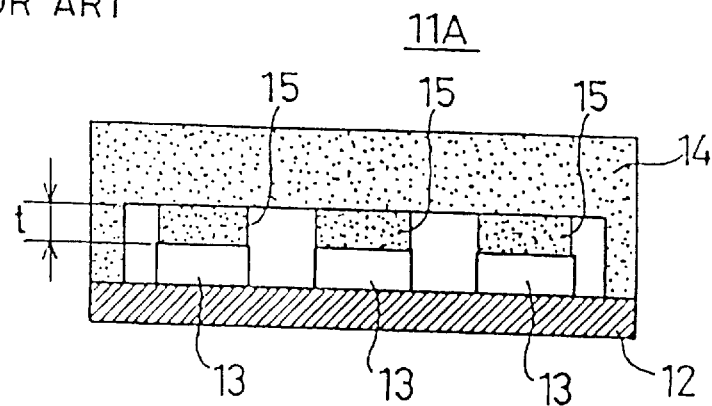
FIG. 1A is a diagram for explaining a conventional cooling device for mounting module.
Figure 1B:
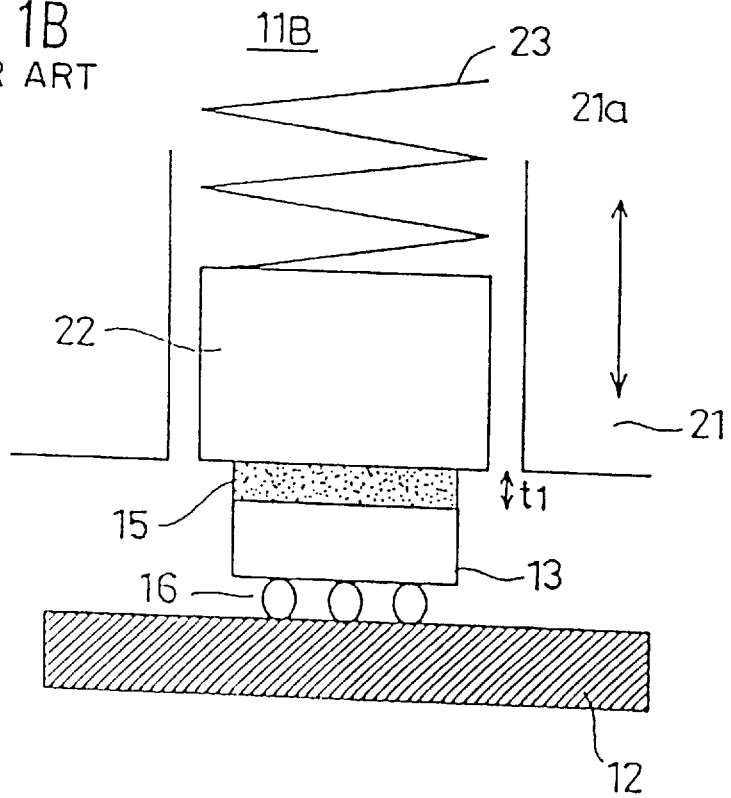
FIG. 1B is a diagram for explaining another conventional cooling device for mounting module.

In order to reduce the value of $R_1$, only $t_1$ may be taken into account since it is difficult to increase $A_1$ which is dominated by the shape of a circuit element. On the other hand, with regard to $R_2$, it is possible to increase the value of $A_2$. Thus, the total thermal resistance R of the embodiment according to the present invention may be reduced to less than that of the cooling device shown in FIG. 1A. Also, since the block $38_1$ is supported by the conductive material 39 and the conductive material 39 has a damper effect, resistance of the cooling device against vibration may be improved.

Figure 3:
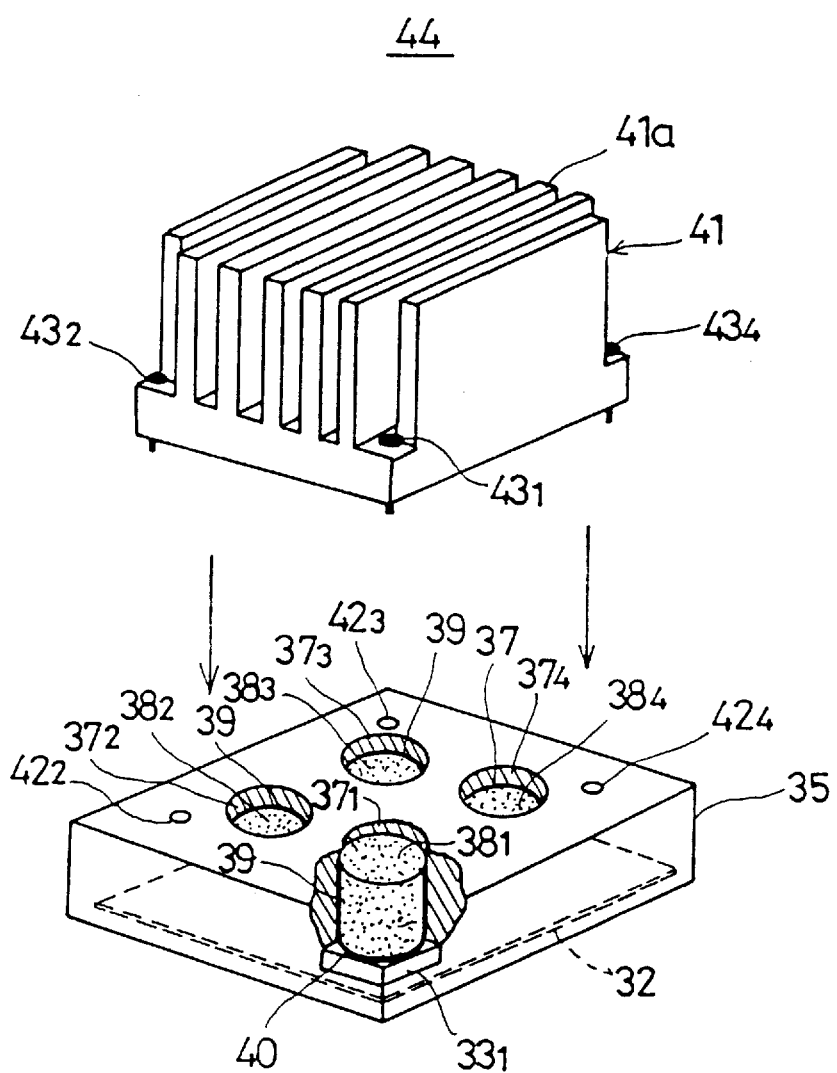
FIG. 3 is a diagram showing an exploded perspective view of the cooling device shown in FIGS. 2A and 2B.

FIG. 3 is a diagram showing an exploded perspective view of the cooling device shown in FIGS. 2A and 2B. In FIG. 3, elements which are the same as the ones in FIGS. 2A and 2B are indicated by the same reference numerals and the explanation thereof will be omitted.

As shown in FIG. 3, fixing holes 42 ($42_1$ to $42_4$, $42_1$ is not shown in the figure) are formed, together with the holes 37 ($37_1$ to $37_4$), in the cooling header 35, which is located above the printed board 32. The blocks 38 ($38_1$ to $38_4$) are inserted in the respective holes 37 ($37_1$ to $37_4$) with the first conductive material 39 applied therebetween. The second conductive material 40 is applied on the other end of each of the blocks 38 ($38_1$ to $38_4$) facing the respective circuit elements 33 ($33_1$ to $33_4$) so that the blocks 38 and the circuit elements 33 are in firm contact.

The heat sink 41 is fixed on the cooling header 35 using screws 43 ($43_1$ to $43_4$, $43_1$ is not shown), which are engaged with the respective fixing holes 42 ($42_1$ to $42_4$), with, for instance, silicon grease (not shown) provided therebetween. A predetermined number of such cooling modules 44 are mounted on the mother board 34.

Figure 4A:
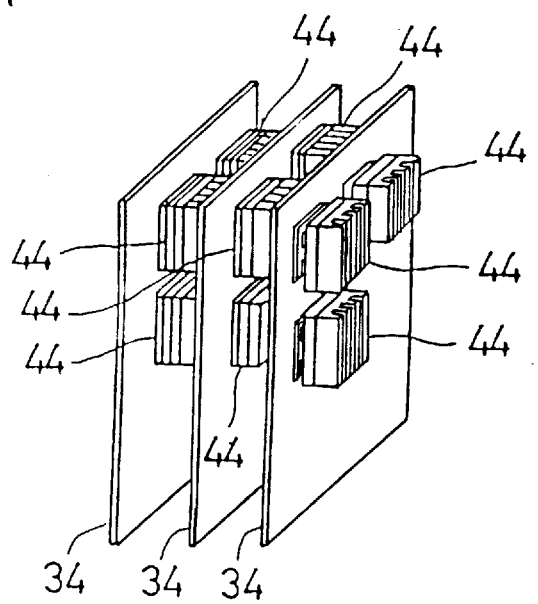
FIG. 4A is a diagram showing a mounting state of the cooling modules on the respective mother board.
Figure 4B:
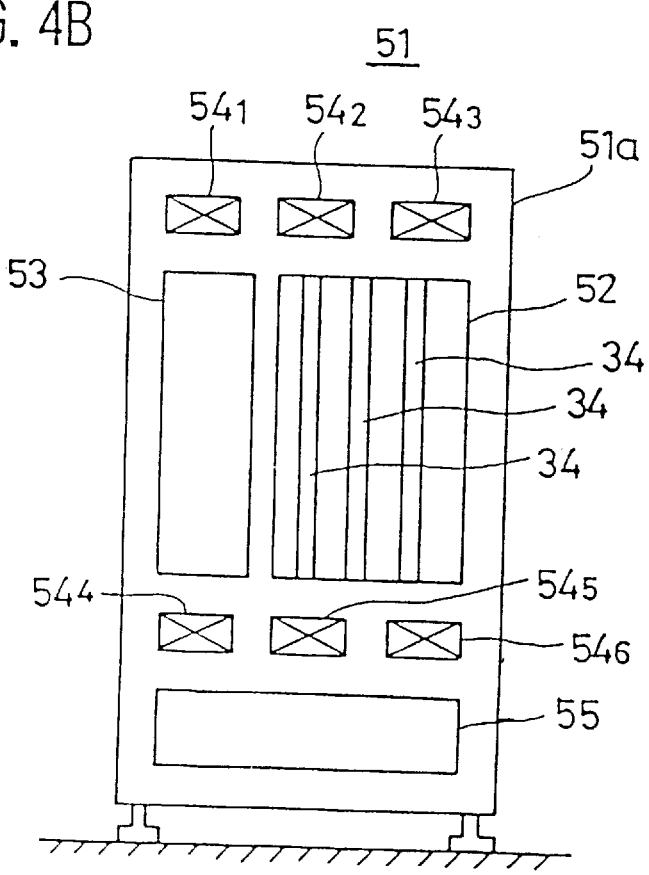
FIG. 4B is a diagram for explaining a device in which the mother boards mounting the cooling modules are provided.

FIG. 4A is a diagram showing a mounting state of the cooling modules 44 on the respective mother board 34 and FIG. 4B is a diagram for explaining a device in which the mother boards 34 mounting the cooling modules 44 is provided. As shown in FIG. 4A, a predetermined number of the cooling modules 44 shown in FIG. 3 are provided on the respective mother board 34 (three, in this case).

FIG. 4B shows main structures located inside of a server 51. In the server 51, three mother boards 34, each of on which a predetermined number of the cooling modules 44 is mounted, are placed on a shelf 52 in a housing 51a. Elements such as interfaces and external memory devices are mounted in a mounting area 53 located in the vicinity of the shelf 52. Fans 54 ($54_1$ to $54_3$) are provided above the shelf 52 and the mounting area 53 and fans 54 ($54_4$ to $54_6$) are provided below the shelf 52 and the mounting area 53. Elements such as a power source 55 may be placed below the fans 54 ($54_4$ to $54_6$).

In the above server 51, circuit elements 33 (not shown) are cooled by cooling the heat sink 41 (not shown) in the cooling modules 44 by creating air flow using the fans 54 ($54_1$ to $54_6$), together with the interfaces and the external memory devices in the mounting area 53.

Figure 5A:
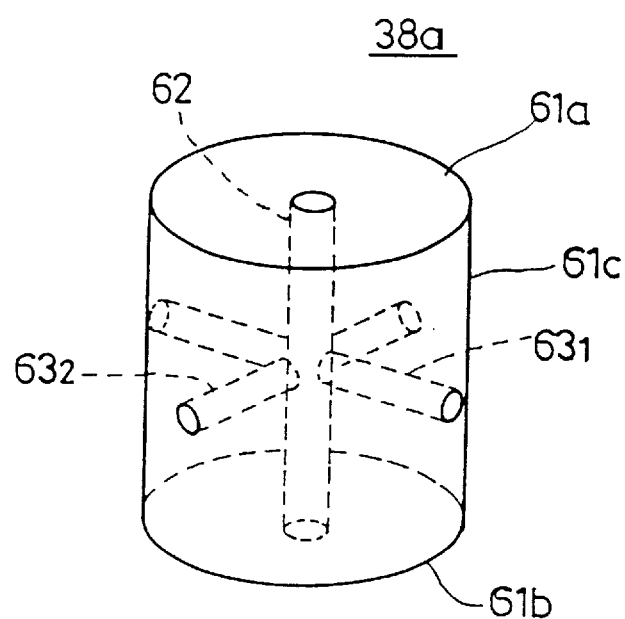
FIG. 5A is a diagram showing an embodiment of the structure of the block explained in the first embodiment.

FIG. 5A is a diagram showing an embodiment of the structure of the block 38 explained in the first embodiment. The block 38a shown in FIG. 5A may be formed by using aluminium in a cylindrical shape, and an injection passage 62 penetrating from the upper surface 61a through the lower surface 61b and a predetermined number (two in this case) of injection passages $63_1$ and $63_2$ penetrating the side surface 61c are formed. In this case, the injection passages 62, $63_1$, and $63_2$ are connected with each other.

Figure 5B:
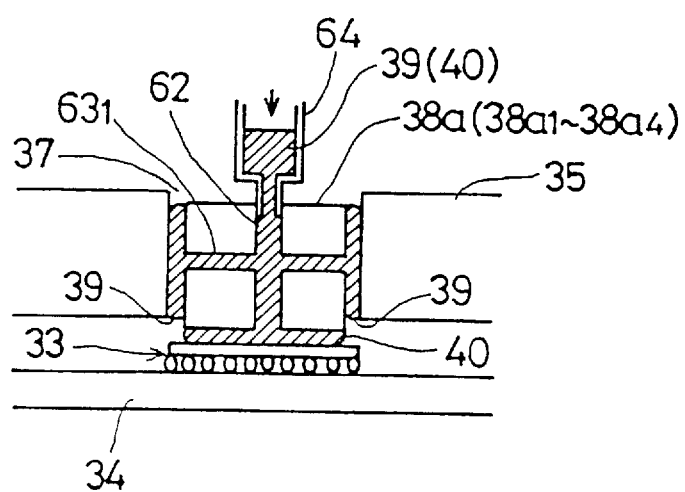
FIG. 5B is a diagram for explaining the injection of conductive material through the injection passages formed in a block.

The above explained block 38 is inserted in the respective hole 37 and the conductive material 39 (40) is injected from the opening of the injection passage 62 located on the upper surface 61a of the block 38a using a cylinder 64. This is shown in FIG. 5B. The conductive material 39 (40) injected in the block 38a passes through the injection passages 62, $63_1$ and $63_2$ and is ejected through the respective opening of the injection passages. Thus, the conductive material 39 may be provided between the side surface of the block 38a and the inside surface of the hole 37. Likewise, the conductive material 40 may be provided between the lower surface of the block 38a and the circuit element 33.

Figure 6A:
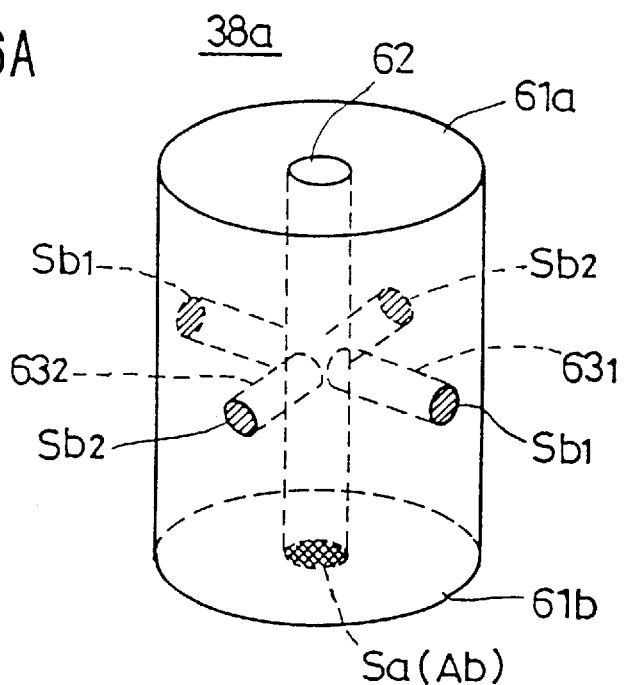
FIG. 6A is a diagram for explaining a relationship between the filling amount of a conductive material and injection passages formed in a block.
Figure 6B:
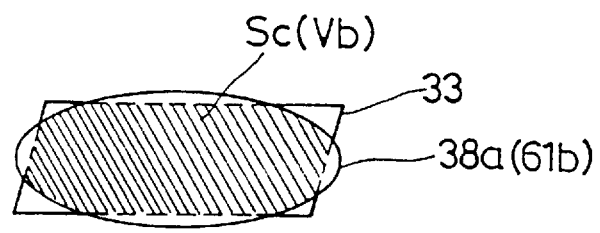
FIG. 6B is a diagram for explaining a relationship between the filling amount of a conductive material and injection passages formed in a block.
Figure 6C:
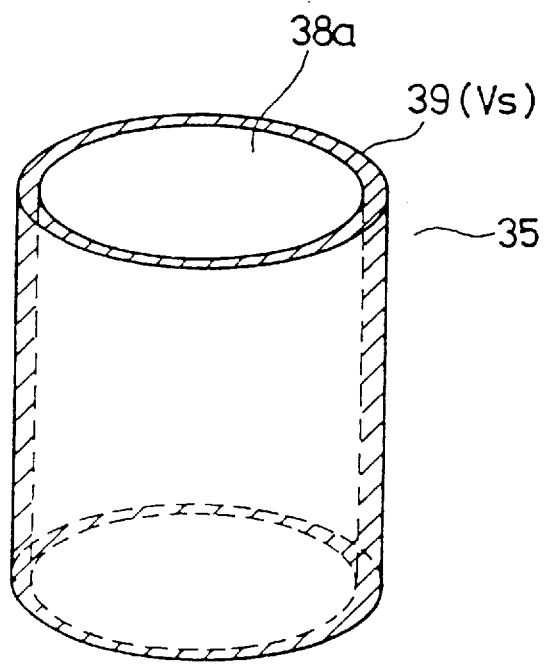
FIG. 6C is a diagram for explaining a relationship between the filling amount of a conductive material and injection passages formed in a block.

FIGS. 6A through 6C are diagrams for explaining a relationship between the filling of the conductive material and the injection passages in the block 38a according to an embodiment of the present invention. In the block 38a shown in FIG. 6A an outlet of the injection passage 62 is indicated by Sa and outlets of the injection passages $63_1$ and $63_2$ are indicated by $Sb_1$ and $Sb_2$, respectively. In FIG. 6B, the shaded portion indicates a contacting area Sc of the circuit element 33 and the lower surface 61b of the block 38. The shaded portion in FIG. 6C indicates a volume, Vs, between the block 38a and the inside surface of the cooling header 35 (i.e., the amount of the conductive material 39 injected therebetween).

The amount Vb of the conductive material 40 filled between the block 38a and the circuit element 33 shown in FIG. 6B may be expressed by the equation:

$$Vb=Sc\times t$$

where t indicates a thickness of the conductive material 40. Therefore, the total outlet surface area, As, in the side surface 61c of the block 38a generated by the injection passages $63_1$ and $63_2$ can be calculated as:

$$As=2Sb_1+2Sb_2$$

On the other hand, the outlet area of the injection passage 62 may be expressed as Sa (Ab), and hence the outlet surface area of the above injection passages 62, $63_1$ and $63_2$ is set so as to satisfies the equation:

$$Ab:As=Vb:Vs$$

That is, according to the embodiment of the present invention, it is possible to homogeneously fill the space between the side surface of the block 38a and the inside surface of the cooling header 35 and that between the lower surface of the block 38a and the circuit element 33 with a desired distribution amount. Thus, the application of the conductive material to the side surface and the lower surface of the block 38a may be carried out at the same time, and the amount of filling of the conductive material may be adjusted in accordance with the pressure exerted by an injection device. Therefore, the filling operation of the conductive material may be simplified and easily automated.

Figure 7A:
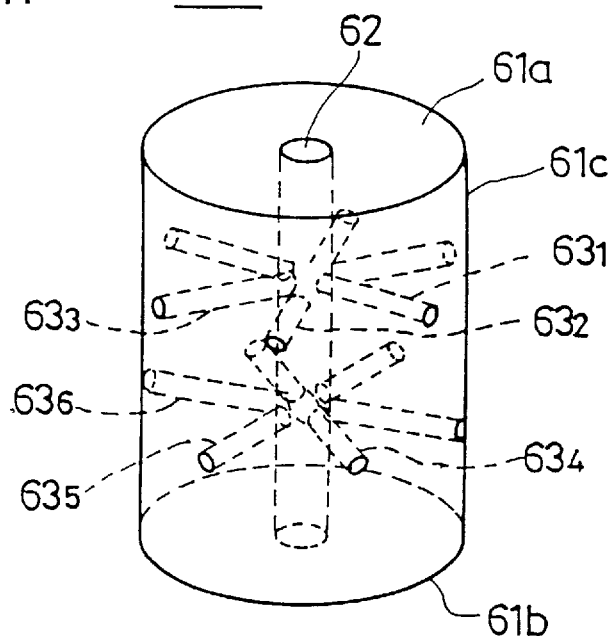
FIG. 7A is a diagram for explaining another embodiment of the injection passages formed in a block according to the present invention.
Figure 7B:
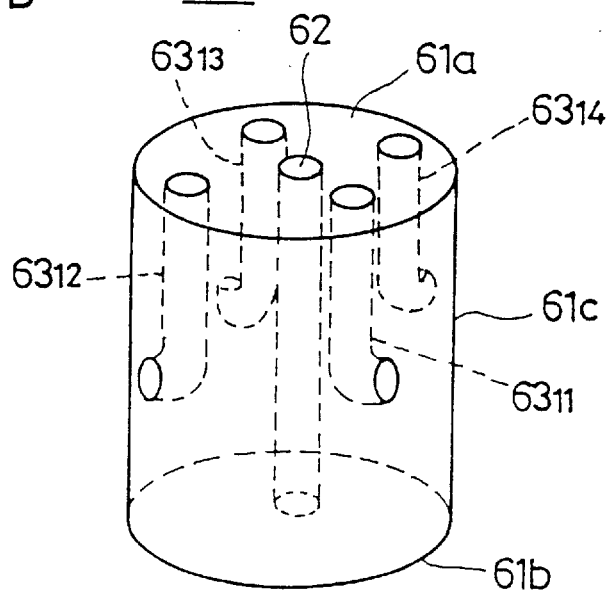
FIG. 7B is a diagram for explaining another embodiment of the injection passages formed in a block according to the present invention.

FIGS. 7A and 7B are diagrams for explaining other embodiments of the injection passages in a block according to the present invention. In FIGS. 7A and 7B, elements which are the same as the ones in FIG. 6A are indicated by the same reference numerals and the explanation thereof will be omitted.

The block 38b shown in FIG. 7A has an injection passage 62 which penetrates an upper surface 61a and a lower surface 61b. Also, injection passages $63_1$ to $63_3$, each of which penetrates the side surface 61c, are formed horizontally with the upper and the lower surfaces 61a and 61b together with injection passages $63_4$ to $63_6$, each of which also penetrates the side surface 61c but is not formed horizontally with the upper and the lower surfaces 61a and 61b. Note that positions of each of the outlets of the injection passages $63_4$ to $63_6$ are different from that of the injection passages $63_1$ to $63_3$. The injection passages 62 and $63_1$ to $63_6$ are connected with each other.

In the block 38b, a conductive material 40 is filled between the lower surface 61b and the circuit element through the injection passage 62 and a conductive material 39 is filled between the side surface 61c and the inner surface of the cooling header through the injection passages $63_1$ to $63_6$. In this case, the outlet surface area of each of the injection passages 62 and $63_1$ to $63_6$ is determined in accordance with the amount of filling respective conductive material as mentioned above.

By using the block 38b shown in FIG. 7A, the space between the side surface 61c and the inner surface of the cooling header may be filled in a more efficient and homogeneous manner.

FIG. 7B shows a block 38c according to another embodiment of the present invention. The block 38c has an injection passage 62 penetrating an upper surface 61a and a lower surface 61b and four injection passages $63_{11}$ to $63_{14}$, each of which penetrates the upper surface 61a and a side surface 61c. That is, each of the injection passages $63_{11}$ to $63_{14}$ is bent inside the block 38c. In this embodiment, an appropriate amount of a conductive material is injected through the respective inlet of the injection passages $63_{11}$ to $63_{14}$ formed in the upper surface 61a of the block 38c.

Figure 8A:
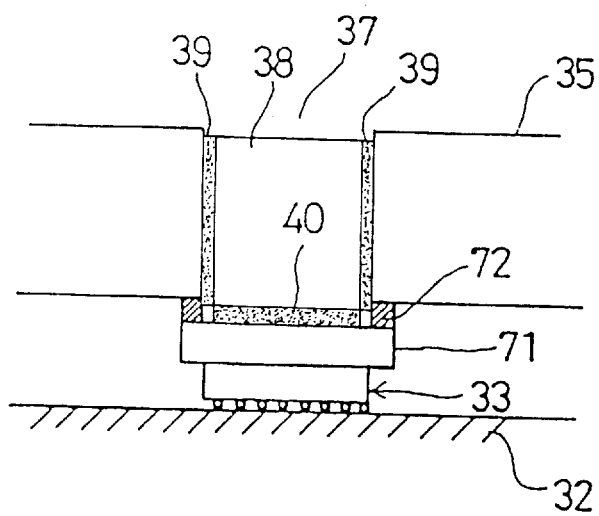
FIG. 8A is a diagram showing a cross-sectional view of main construction parts in another example of the first embodiment according to the present invention.
Figure 8B:
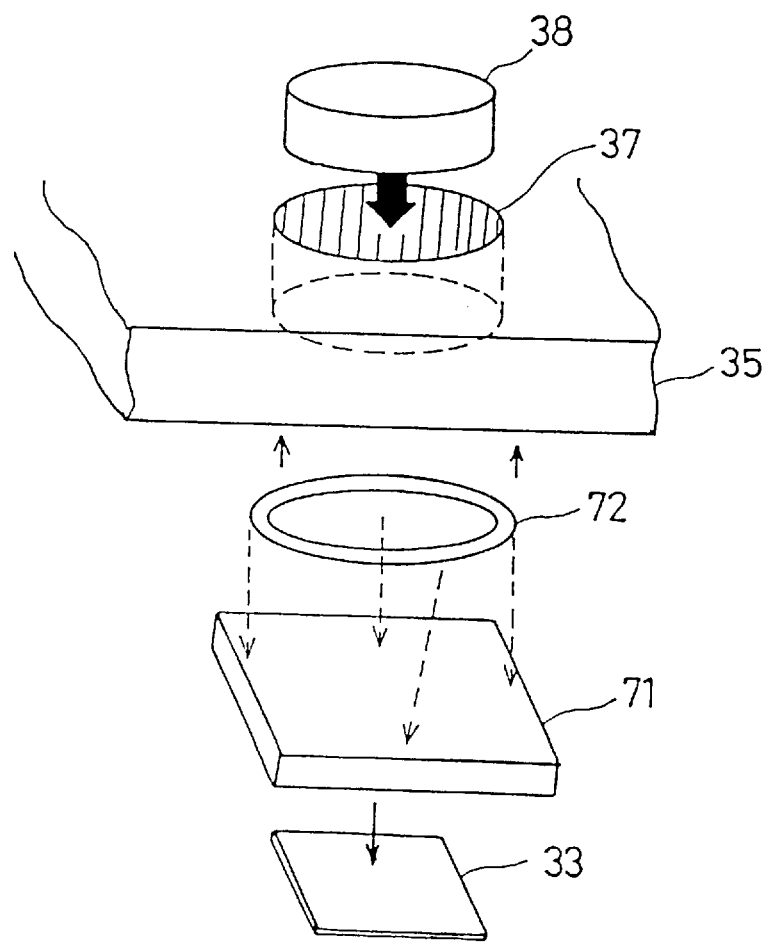
FIG. 8B is a diagram showing an exploded view of main construction parts in another example of the first embodiment according to the present invention.

FIGS. 8A and 8B are diagrams showing, respectively, main construction parts in another example of the first embodiment according to the present invention. FIG. 8A shows a cross-sectional view and FIG. 8B shows an exploded perspective view.

In FIGS. 8A and 8B, a heat spreader 71, which is a second conductive member formed by a metal having a good conductivity such as aluminium, is provided on a circuit element 33 mounted on a printed board 32. The heat spreader 71 is thermally connected to the circuit element 33 by using such material as a conductive adhesive composition. The heat spreader 71 is connected to a cooling header 35 via an O-ring 72 which is a sealing member.

The O-ring 72 is formed by an elastic member having a certain heat resistance such as a heat resistant rubber and it is positioned so as to fit a hole 37 formed in the cooling header 35. When the block 38 is inserted in the hole 37, it contacts the heat spreader 71 via a conductive material 40. That is, the conductive material 40 is placed in the O-ring 72. In addition, the block 38 is supported by a conductive material 39 in the hole 37 as explained above.

Now, when one of the cooling modules 44, shown in FIG. 4A, mounted on the mother board 34 using solder balls, is exchanged, the module 44 is first heated on the mother board 34 in order to melt the solder balls. When a liquid is used as a heating medium in the above operation, there is a danger that the liquid contacts the other modules 44 which are not supposed to be exchanged and the conductive materials 39 and 40 are dissolved. Also, although a flux washing of the mother board 34, in which the mother board 34 is immersed in a washing liquid and shaken, is often carried out after the exchange of the module 44, there is a possibility that some of the conductive material is dissolved in the washing liquid. If the conductive material is dissolved, the thermal resistance at a contacting surface of the cooling header is increased and the cooling efficiency of the cooling module is lowered. One of the reasons that the O-ring 72 is employed in the embodiment shown in FIGS. 8A and 8B is to prevent the leaking of the conductive materials 39 and 40 in the above cases.

Figure 9:
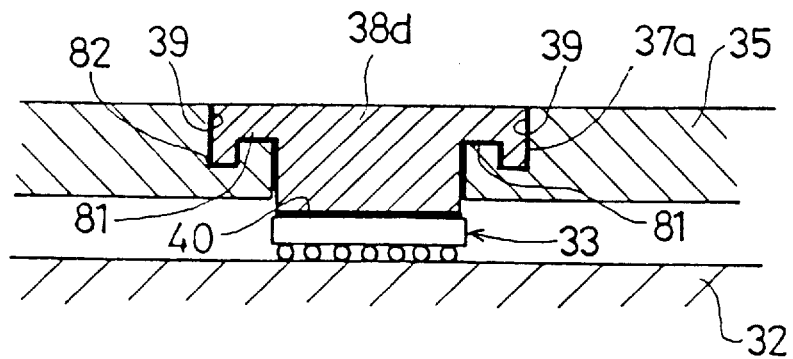
FIG. 9 is a diagram showing a cross-sectional view of main construction parts of a second embodiment according to the present invention.
Figure 10A:
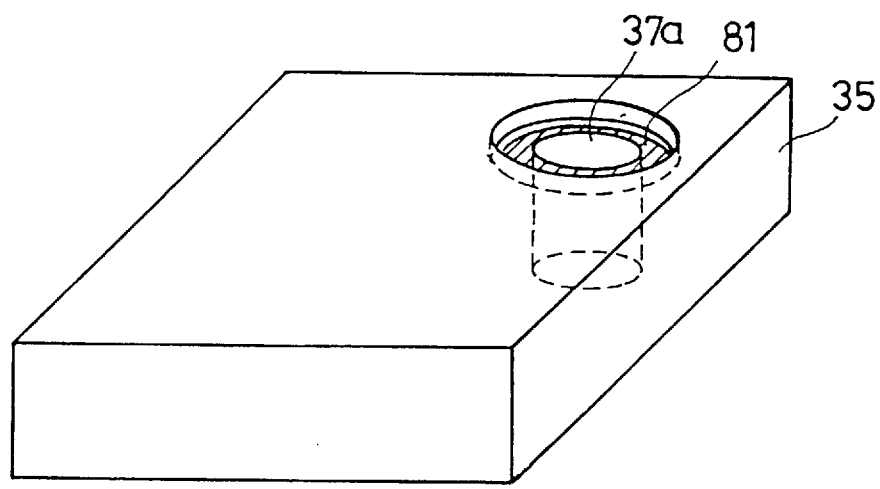
FIG. 10A is a diagram for explaining the cooling header shown in FIG. 9.
Figure 10B:
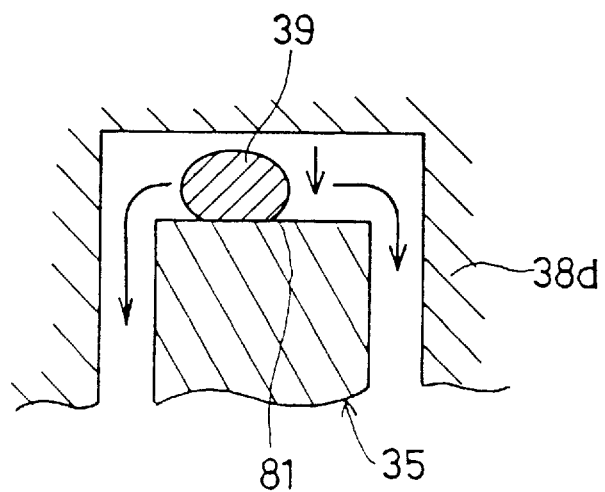
FIG. 10B is a diagram for explaining the cooling header shown in FIG. 9.

FIG. 9 is a diagram showing a cross-sectional view of main construction parts of a second embodiment according to the present invention and FIGS. 10A and 10B are diagrams for explaining the cooling header shown in FIG. 9. In FIGS. 9 and 10A and 10B, elements which are the same as the ones in the previous figures are indicated by the same reference numerals and the explanation thereof will be omitted.

According to the second embodiment of the present invention, a block 38d is provided with an extending portion 82 extending from the upper portion of the side surface, which has a hook shape as shown in the FIGS. 9 and 10A. Likewise, a cooling header 35 is provided with a hook portion 81, projecting from the lower portion of the inner surface of a hole 37a, which is formed to be engaged with the extending portion 82 of the block 38d.

When the block 38d is inserted in the hole 37a of the cooling header 35 in an engaged state, a conductive material 39 is applied between the side surfaces of the block 38d and the cooling header 35, and a conductive material 40 is provided between the block 38d and a circuit element 33. The conductive material 39 may be filled between the side surfaces of the block 38d and the cooling header 35 by applying the conductive material 39 on the hook portions 81 of the cooling header 35 as shown in FIG. 10B prior to the insertion of the block 38d, and spreading the conductive material 39 using the pressurizing force generated upon the insertion of the block 38d. In this manner, the conductive material 39 may be filled easily.

Figure 11:
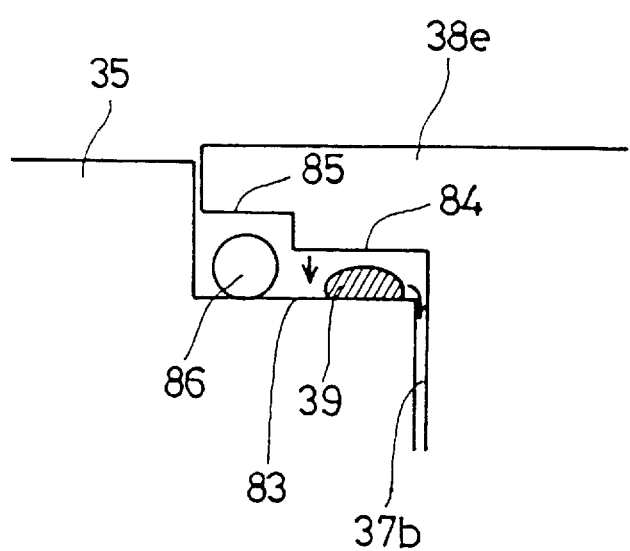
FIG. 11 is a diagram showing a cross-sectional view of main construction parts used in another example according to the second embodiment of the present invention.

FIG. 11 is a diagram showing a cross-sectional view of main construction parts used in another example according to the second embodiment of the present invention. As shown in FIG. 11, a step portion 83 is formed with the upper side surface of the hole 37b of the cooling header 35, and an engaging portion 84 and a seal engaging portion 85 are formed with a block 38e. According to this example of the second embodiment, an O-ring 86, which is a sealing member made of an elastic such as a rubber, is placed around the step portion 83 as shown in the figure and the conductive material 39 is applied on the step portion 83 inside of the O-ring 86.

When the block 38e is inserted in the hole 37b, the O-ring 86 is pressed by the seal engaging portion 85 and functions as a sealing member for the conductive material 39. The conductive material 39 is pressed by the engaging portion 84 and fills the space between the side surface of the cooling header 35 and the block 38e. The filling operation can be carried out smoothly since the O-ring 86 prevents the flow of the conductive material 39 in the reverse direction.

Figure 12A:
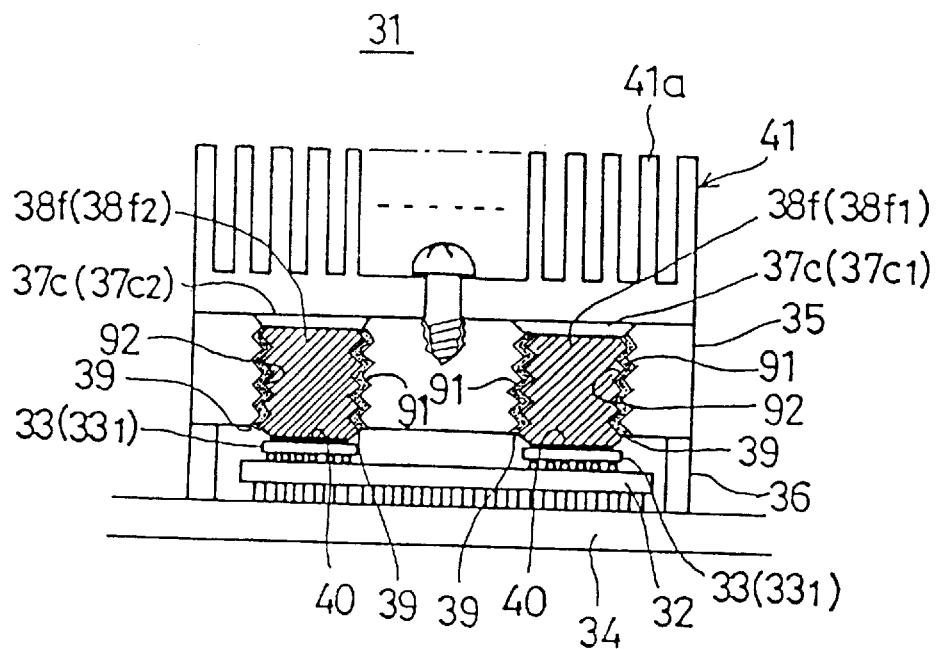
FIG. 12A is a diagram for showing cross-sectional structural view of a cooling device according to the third embodiment of the present invention.
Figure 12B:
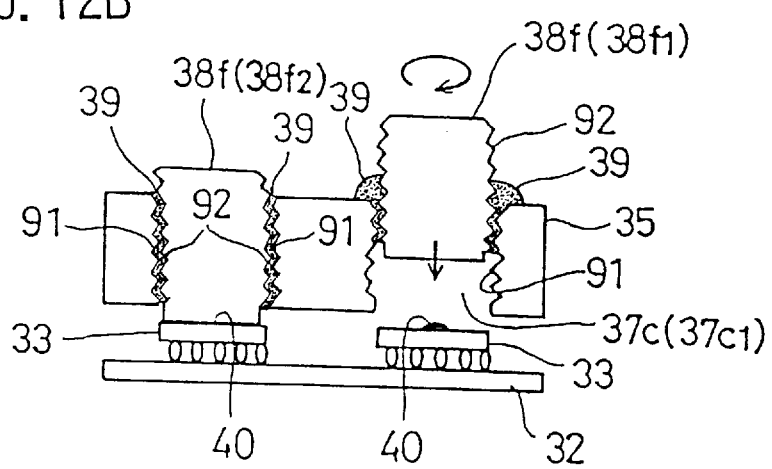
FIG. 12B is a diagram for explaining the cooling device according to the third embodiment of the present invention.

FIGS. 12A and 12B, respectively, are diagrams for showing cross-sectional structural views of a cooling device according to the third embodiment of the present invention. In FIGS. 12A and 12B, elements which are the same as the ones in the previous figures are indicated by the same reference numerals and the explanation thereof will be omitted.

In a cooling device shown in FIG. 12A, a screw thread 92 is formed on each of blocks $38f$ ($38f_1$ to $38f_2$), which is a first conductive member, and a screw thread 91 is formed inside of each of holes 37c ($37c_1$ to $37c_2$) formed in a cooling header 35. The block $38f$ ($38f_1$ to $38f_4$) are driven in the respective holes 37c ($37c_1$ to $37_2$) with a conductive material 39 provided therebetween. Also, a heat sink 41 is fixed to the cooling header 35 using, for instance, a screw 93 as shown in FIG. 12A and a conductive material such as silicon grease may be provided between the cooling header 35 and the heat sink 41. Other features of this cooling device are substantially the same as the one shown in FIG. 2A.

When the blocks $38f$ ($38f_1$ to $38f_2$) are driven in the holes 37c ($37c_1$ to $37c_2$), the conductive material 39 may be applied around the holes 37c beforehand so that it is spread and filled around the blocks 38f when each of the blocks 38f is rotated and driven in the respective hole 37c. Also, a conductive material 40 may be filled between the block 38f and a circuit element 33 by applying the conductive material 40 on the circuit element 33 beforehand and pressing the conductive material 40 by inserting the block 38f in the hole 37c. This is shown in FIG. 12B.

According to the above embodiment, since the block 38f ($38f_1$ to $38f_4$) has a screw thread 92 and is driven in the hole 37c, the thickness of the conductive material 40 on the circuit element 33 may be homogeneously adjusted, and hence the resistance against vibration may be improved. Also, since the contacting area of the block 38f may be increased due to the presence of the screw thread 92 (and 91), the cooling performance of the device may be enhanced.

Figure 13A:
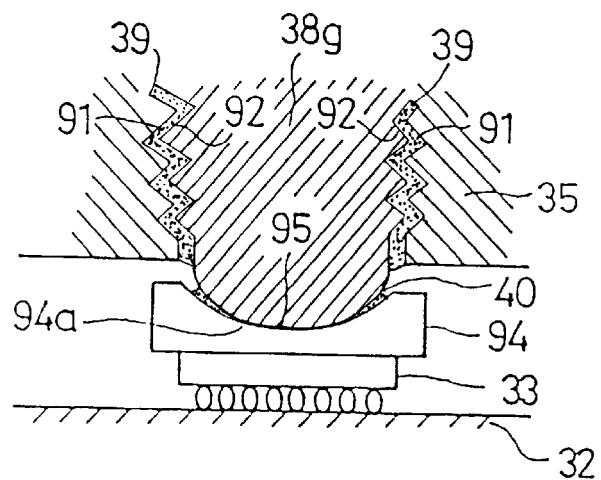
FIG. 13A is a diagram showing a cross-sectional structural views of another example of the third embodiment according to the present invention.
Figure 13B:
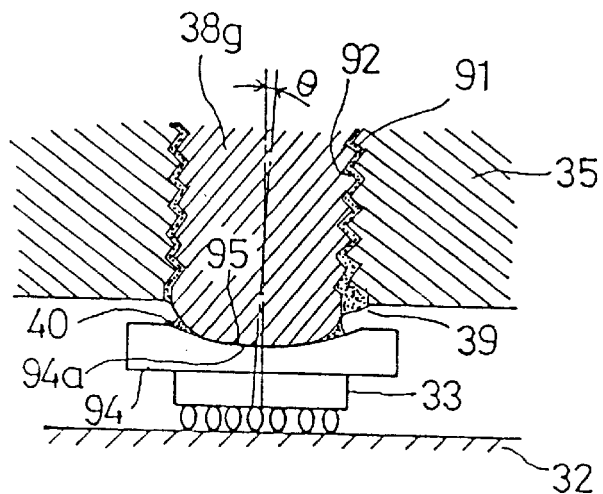
FIG. 13B is a diagram for explaining another example of the third embodiment according to the present invention.

FIGS. 13A and 13B are diagrams showing cross-sectional structural views of another example of the third embodiment according to the present invention.

As shown in FIG. 13A, according to this example, a heat spreader 94, which is a second conductive member, having a concave portion 94a may be fixed on a circuit element 33 mounted on a printed board 32 using, for instance, a thermal conductive adhesive composition. On the other hand, a convex portion 95, whose shape is formed so as to correspond to the concave portion 94a of the heat spreader 94, is formed at the end of a block 38g. The convex portion 95 of the block 38g contacts the concave portion 94a of the heat spreader 94 through a conductive material 40. Other features of the device are substantially the same as the one shown in FIG. 12A.

There is a case in which a shift θ in the central axis of a block is caused when the end of the block has a flat shape, and the inclination of the block generates an uneven thickness of the conductive material 40, which may lead to a decreased cooling efficiency of the device. According to this embodiment, however, a shift θ in the central axis of a block 38g may not occur due to the engagement of the concave portion 94a of the heat spreader 94 and the convex portion 95 of the block 38g as shown in FIG. 13B. Thus, the thickness of the conductive material 40 may be evenly maintained and a stable cooling performance of the device may be obtained.

Figure 14:
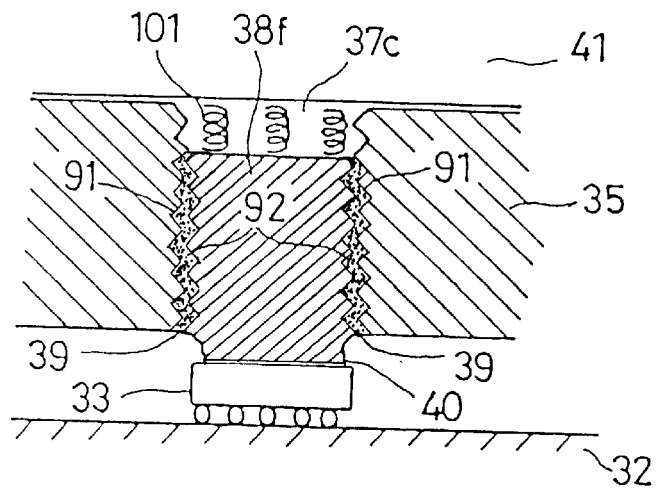
FIG. 14 is a diagram showing a cross-sectional view of main construction parts of a cooling device according to a fourth embodiment of the present invention.

FIG. 14 is a diagram showing a cross-sectional view of main construction parts of a cooling device according to a fourth embodiment of the present invention. In FIG. 14, elements which are the same as the ones in the previous figures are indicated by the same reference numerals and the explanation thereof will be omitted.

The cooling device according to this embodiment is characterized by the presence of a predetermined number of elastic members 101 such as a spring, which is located between a heat sink 41 and a block 38f in a hole 37c of a cooling header 35 in order to press the block 38f in the circuit element 33 direction. Other features of the device are substantially the same as the one shown in FIG. 12A.

The predetermined number of elastic members 101 presses the block 38f so as to reduce the space present between the screw thread 91 of the hole 37c and the screw thread 92 of the block 38f. Therefore, even when the block 38 having a flat end is used, the thickness of the conductive material 40 may be maintained evenly and the cooling performance of the device may be improved.

Figure 15A:
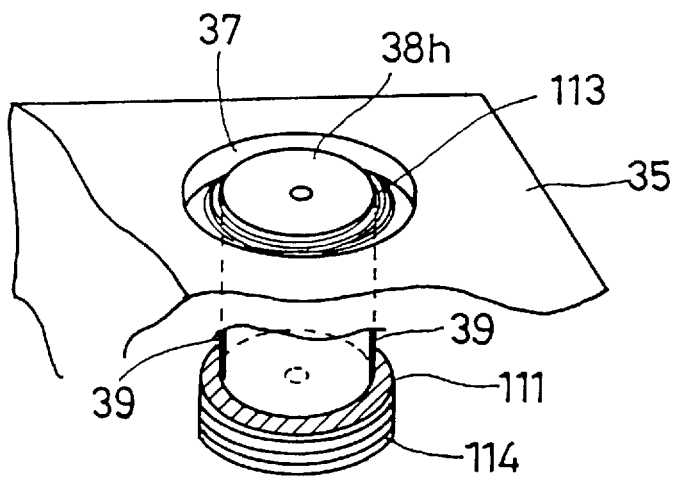
FIG. 15A is a diagram for explaining a fifth embodiment of a cooling device according to the present invention.
Figure 15B:
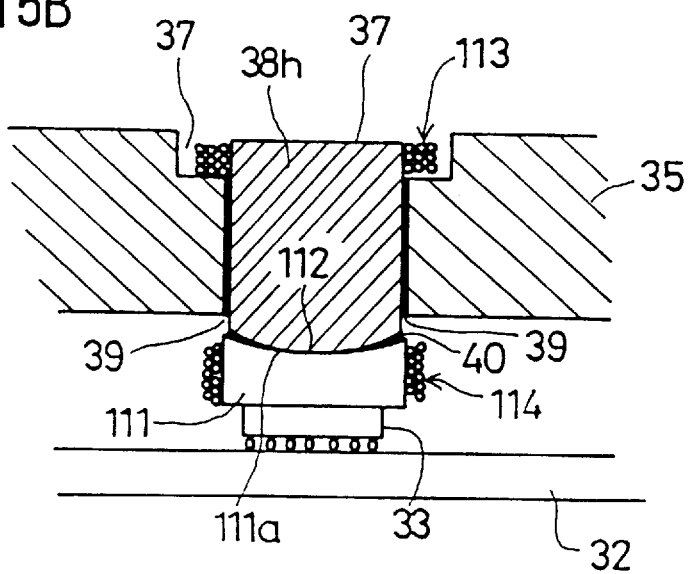
FIG. 15B is a diagram for explaining the fifth embodiment of a cooling device according to the present invention.

FIGS. 15A and 15B are diagrams for explaining a fifth embodiment of a cooling device according to the present invention. FIG. 15A shows a partially-cut conceptional perspective view of a cooling device and FIG. 15B shows a cross-sectional view of main construction parts of the device. In FIGS. 15A and 15B, elements which are the same as the ones in the previous figures are indicated by the same reference numerals and the explanation thereof will be omitted.

According to the fifth embodiment of the present invention, a heat spreader 111, which is a second conductive member, is fixed on a circuit element 33 mounted on a printed board 32 using, for instance, a thermally conductive adhesive composition. A concave portion 111a is provided on the upper surface of the heat spreader 111 as shown in FIG. 15B.

On the other hand, a convex portion 112 is formed at one end of a block 38h which is inserted in a hole 37. The block 38h is supported by a conductive material 39 in the hole 37 and the convex portion 112 contacts to the concave portion 111a of the heat spreader 111 via a conductive material 40.

Also, a coil 113 is provided around the upper portion of the block 38h and a coil 114 is provided around the side surface of the heat spreader 111. That is, an electromagnet is formed by the block 38h having the coil 113 and the heat spreader 111 having the coil 114.

Therefore, according to the fifth embodiment of the present invention, the block 38h is electromagnetically attached to the heat spreader 111 via the conductive material 40 when a current is applied to the coils 113 and 114. In this manner, it is possible to carry out a pressurizing operation of the block 38h to the heat spreader 111 without asserting any pressure on the circuit element 33 and the printed board 32. Thus, the danger that the circuit element 33 or the printed board 32 is damaged during the pressurizing operation may be eliminated. Also, the thickness of the conductive material 40 may be maintained evenly and the cooling performance of the device may be improved.

It is obvious that the present invention is not limited to the above-mentioned embodiments, and variations and modifications may be made without departing from the scope of the present invention.

What is claimed is:

1. A cooling device for a mounting module in which heat generated from a predetermined number of circuit elements mounted on said mounting module is dissipated by a cooling means, comprising:

at least one conduction means which thermally connects said circuit elements with said cooling means, wherein said conduction means includes a predetermined number of first conductive members placed in a respective hole formed in said conduction means, said first conductive members being movably supported by a first conductive material filled between a side surface of said first conductive members and a surface of said respective hole formed in said conduction means, a second conductive material is provided between said first conductive material and said circuit element, and a predetermined number of injection passages for filling one of said first conductive material and said second conductive material, and said first conductive material and said second conductive material are provided with said first conductive member.

2. The cooling device for a mounting module as claimed in claim 1, wherein said first conductive material has substantially an even thickness extending around said first conductive member.

3. The cooling device for a mounting module as claimed in claim 1, wherein at least two of said predetermined number of injection passages are connected with each other.

4. The cooling device for a mounting module as claimed in claim 3, wherein said at least two of said predetermined number of injection passages include an injection passage for filling said first conductive material and an injection passage for filling said second conductive material.

5. The cooling device for a mounting module as claimed in claim 4, wherein the ratio of a total outlet surface area of said injection passages for filling said first conductive material and a total outlet surface area of said injection passages for filling said second conductive material is substantially the same as a ratio of an amount of said first conductive material to be filled around a side surface of said first conductive member and an amount of said second conductive material to be filled between said circuit element and said first conductive member.

6. The cooling device for a mounting module as claimed in claim 1, wherein said first conductive member includes an extending portion having a hook shape, and said conduction means includes a hook portion engageable with said extending portion of said first conductive member.

7. The cooling device for a mounting module as claimed in claim 6, wherein said first conductive material is present between said extending portion of said first conductive member and said hook portion of said conduction means.

8. The cooling device for a mounting module as claimed in claim 1, wherein a predetermined number of elastic members is provided between said first conductive member and said cooling means in order to press said first conductive member towards said circuit element.

9. The cooling device for a mounting module as claimed in claim 6, wherein a second conductive member is provided between said circuit element and said first conductive member, and said second conductive material is present between said first conductive member and said second conductive member.

10. The cooling device for a mounting module as claimed in claim 9, wherein said second conductive member has an upper portion having a concave shape, facing said first conductive member, and said first conductive member has a lower portion having a convex shape engageable with said concave shape of said upper portion of said second conductive member.

11. The cooling device for a mounting module as claimed in claim 9, wherein a sealing member is provided on said second conductive member in order to seal said second conductive material.

12. The cooling device for a mounting module as claimed in claim 1, wherein said conduction means includes a step portion engageable with an extending portion of said first conductive member, said first conductive material applicable to said step portion.

13. The cooling device for a mounting module as claimed in claim 12, wherein a sealing member is provided on said step portion.

14. A cooling device for a mounting module in which heat generated from a predetermined number of circuit elements mounted on said mounting module is dissipated by a cooling member comprising:

at least one conduction member to thermally connect said circuit elements with said cooling member;

wherein said conduction member includes a predetermined number of first conductive members placed in a respective hole formed in said conduction member, said first conductive members being movably supported by a first conductive material filled between a side surface of said first conductive members and a surface of said respective hole formed in said conduction member and by a second conductive material disposed between a lower surface of said first conductive member and said circuit elements.

* * * * *